(12) United States Patent
Otsuka

(10) Patent No.: US 7,957,176 B2
(45) Date of Patent: Jun. 7, 2011

(54) SEMICONDUCTOR MEMORY DEVICE WITH IMPROVED RESISTANCE TO DISTURBANCE AND IMPROVED WRITING CHARACTERISTIC

(75) Inventor: Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1040 days.

(21) Appl. No.: 11/753,111

(22) Filed: May 24, 2007

(65) Prior Publication Data

US 2007/0274124 A1 Nov. 29, 2007

(30) Foreign Application Priority Data

May 26, 2006 (JP) .................................. 2006-146521

(51) Int. Cl.
*G11C 11/00* (2006.01)
(52) U.S. Cl. ......................... 365/154; 365/226; 365/229
(58) Field of Classification Search .................. 365/154, 365/226, 229, 185.22, 205, 230.06, 189.01, 365/51, 63, 227, 228
See application file for complete search history.

(56) References Cited

U.S. PATENT DOCUMENTS

| | | | | |
|---|---|---|---|---|
| 7,092,280 B2 * | 8/2006 | Joshi | .............................. | 365/154 |
| 7,447,058 B2 * | 11/2008 | Maki et al. | ..................... | 365/154 |
| 2004/0179406 A1 * | 9/2004 | Kushida | ......................... | 365/188 |
| 2006/0098475 A1 * | 5/2006 | Ohtake et al. | .................. | 365/154 |
| 2006/0158926 A1 * | 7/2006 | Yokoyama | ..................... | 365/154 |

OTHER PUBLICATIONS

K. Zhang, et al., "A 3-GHz 70Mb SRAM in 65nm CMOS Technology with Integrated Column-Based Dynamic Power Supply," International Solid-State Circuits Conference (ISSCC) Digest of Technical Papers, Session 26, Non-Volatile Memory, 26.1, Feb. 9, 2005, pp. 474-475, 611.

Masanao Yamaoka, et al., "Low-Power Embedded SRAM Modules with Expanded Margins for Writing," International Solid-State Circuits Conference (ISSCC) Digest of Technical Papers, Session 26, Static Memory, 26.4, Feb. 9, 2005, pp. 480-481, 611.

* cited by examiner

*Primary Examiner* — Dang T Nguyen
(74) *Attorney, Agent, or Firm* — Oblon, Spivak, McClelland, Maier & Neustadt, L.L.P.

(57) ABSTRACT

A semiconductor memory device includes a first inverter ad a second inverter, a first power supply control circuit, and a second power supply control circuit. The first and second inverters constitute a memory cell and each have an input terminal and an output terminal connected crosswise to an output terminal and an input terminal, respectively, of the other. The first power supply control circuit supplies a first voltage to the first inverter. The second power supply control circuit supplies a second voltage to the second inverter. The first and second power supply control circuits control the first and second voltages, respectively, supplied to the first and second inverters in a selected memory cell for a writing operation in accordance with write data.

13 Claims, 10 Drawing Sheets

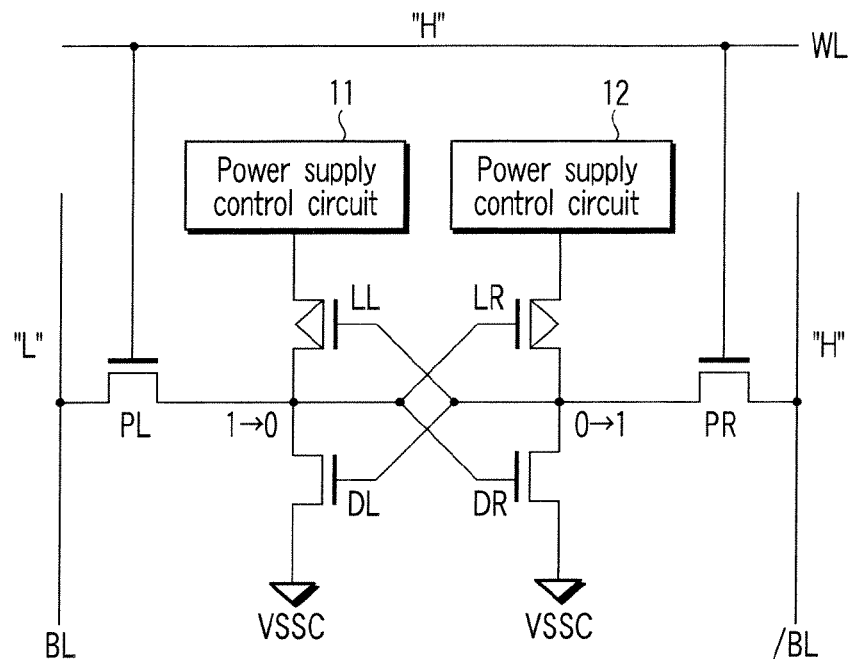
F I G. 1
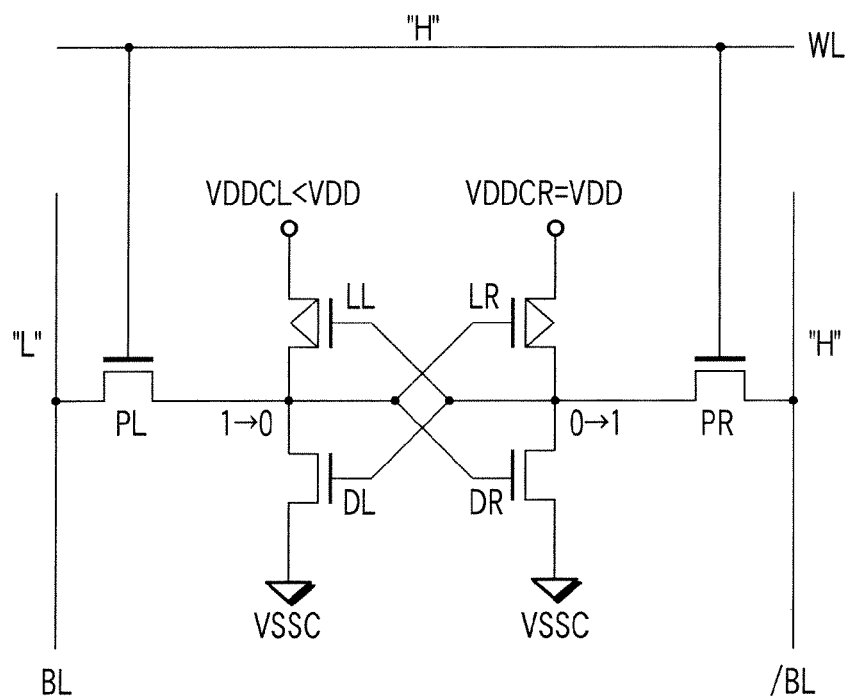
F I G. 2

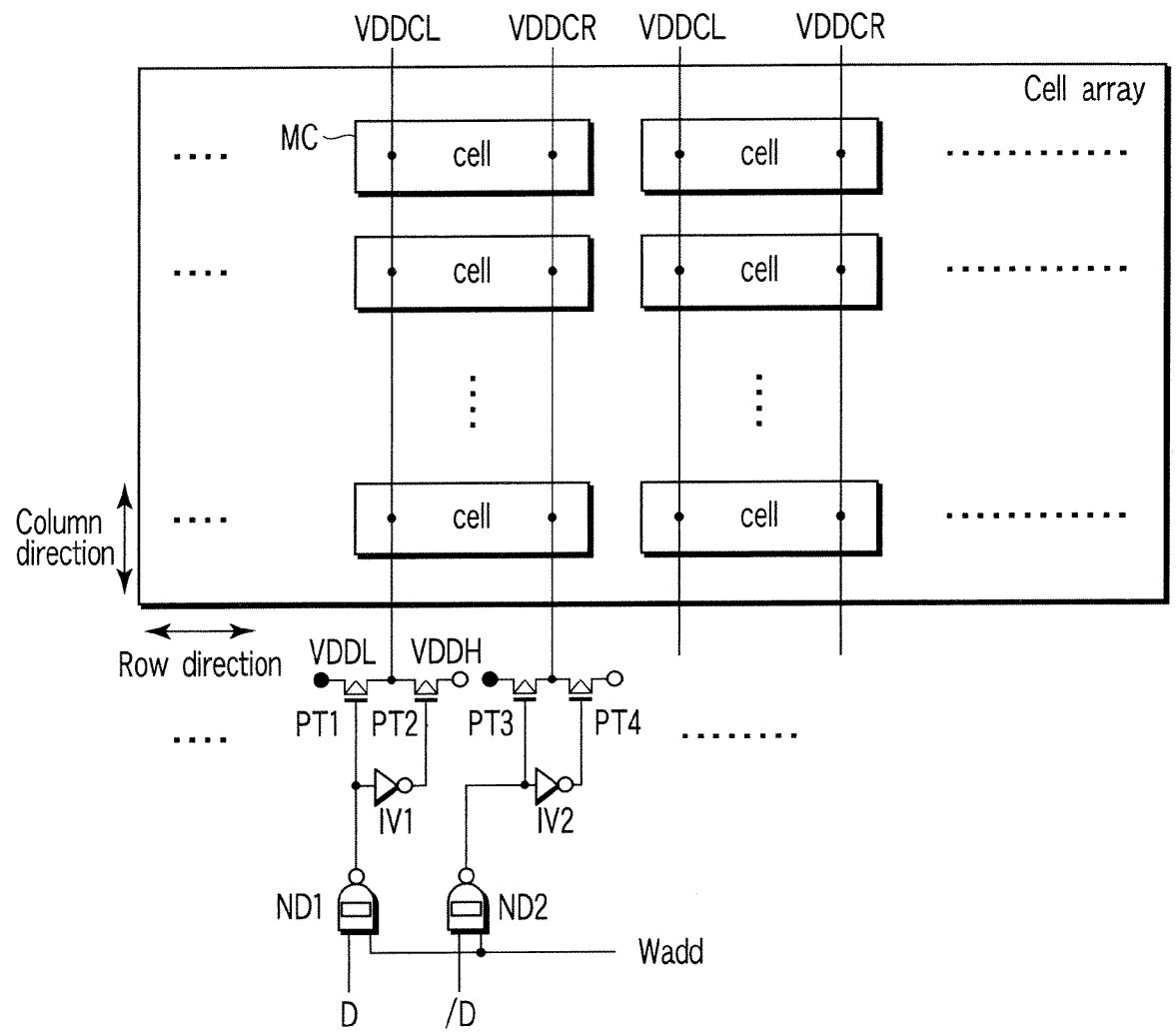
F I G. 3

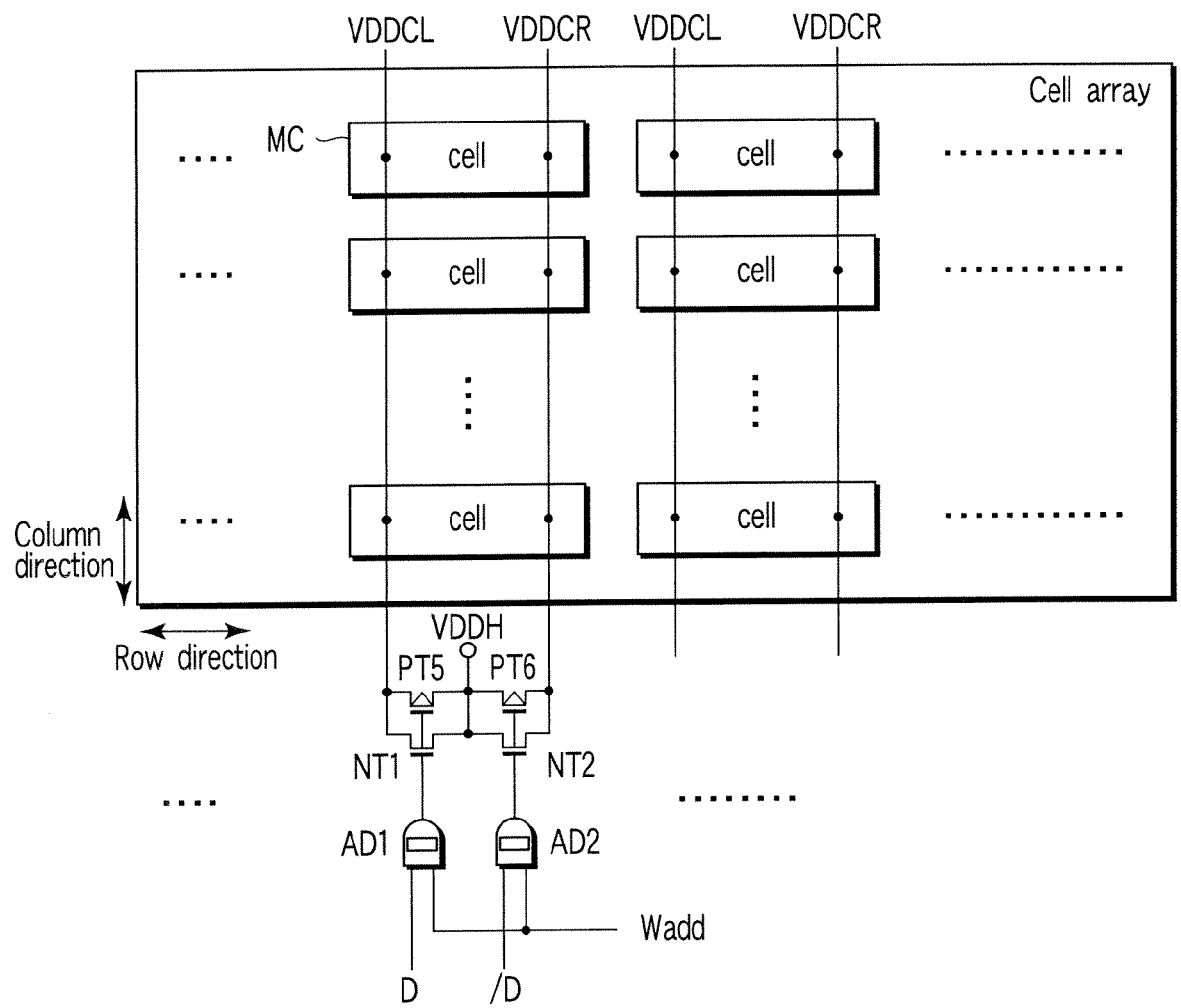
F I G. 5

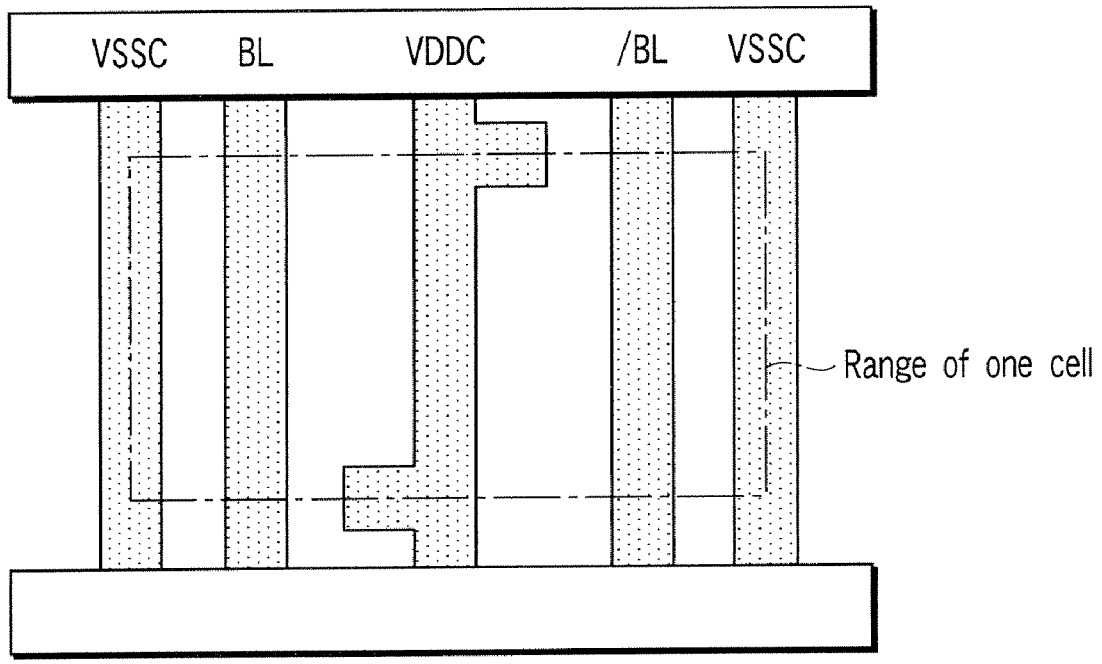
F I G. 7A
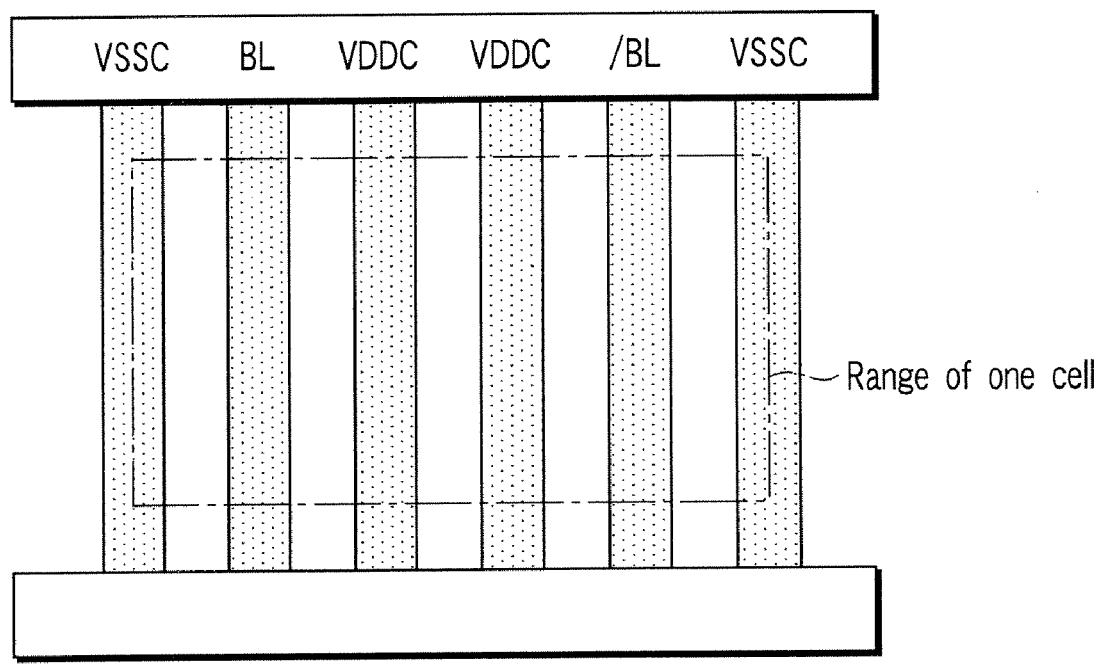
F I G. 7B

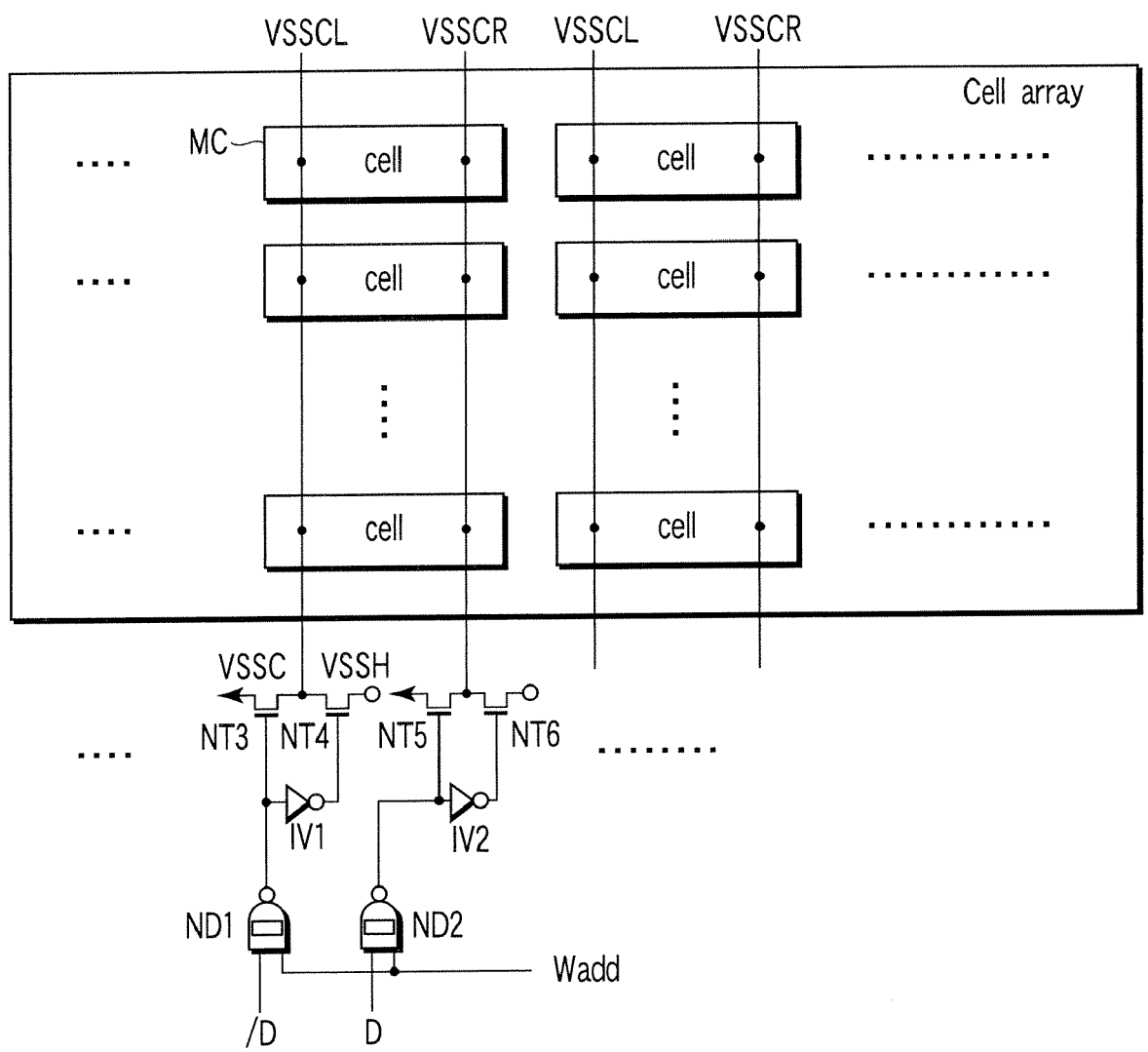
F I G. 9

| | Selected column | Unselected column |
|---|---|---|
| Reading operation | VDDC>VDD | |
| Writing operation | VDDC<VDD | VDDC>VDD |

SEMICONDUCTOR MEMORY DEVICE WITH IMPROVED RESISTANCE TO DISTURBANCE AND IMPROVED WRITING CHARACTERISTIC

CROSS-REFERENCE TO RELATED APPLICATIONS

This application is based upon and claims the benefit of priority from prior Japanese Patent Application No. 2006-146521, filed May 26, 2006, the entire contents of which are incorporated herein by reference.

BACKGROUND OF THE INVENTION

1. Field of the Invention

The present invention relates to semiconductor memory devices, for example, static random access memories (hereinafter referred to as SRAMs).

2. Description of the Related Art

Current SRAM memory cells are mostly CMOS 6-transistor cells each comprising six MOS transistors. The CMOS 6-transistor cell comprises a flip flop comprising two CMOS inverters and two transfer gates connecting respective nodes of the flip flop to a pair of bit lines. An SRAM is characterized by its capability of stably holding data on the basis of its flip flop, which statically stores data.

However, to improve the performance of LSIs (Large Scale Integrated Circuits) and to increase the number of elements mounted, elements have been increasingly miniaturized and power voltages have been correspondingly scaled. Further, with the miniaturized elements, a threshold voltage Vth for the transistors, which should be controlled to a uniform value, has significantly varied randomly among the elements.

A static noise margin (SNN) is an index for the operational margin of SRAM. SNM is well known as what is called the butterfly curve of SRAM cells which correspond to the I/O characteristics of two inverters constituting a flip flop, the I/O characteristics being allowed to overlap each other while a word line for the cell is in a selected state, that is, while the transistors of the transfer gates are on. In other words, SNM is a voltage margin during operation. Even with deviating I/O characteristics resulting from noise, SNM works until the butterfly curve is disrupted to destroy data. A higher SNM makes the data holding characteristic of the cell more stable. A difference from normal inverter characteristics is that turning on the word line raises a low ("L") level voltage to an intermediate potential by means of the level (normally a high ("H") level) of the bit line connected to the cell via the transfer gate; the intermediate potential is determined by the ratio of the driving force of the transfer gate and the driving force of a driver (an N channel MOS transistor constituting the inverter).

As previously described, scaling the power supply voltage causes the butterfly curve to be generally scaled, obviously reducing SNM. Moreover, when a random variation in threshold voltage Vth varies the characteristics of the six transistors constituting the cell, the characteristics of the two inverters constituting the flip flop deviate from each other. This makes the butterfly curve asymmetric, making the SNM of the SRAM cell depend on the lower one of the right and left butterfly curve. When the power supply voltage is scaled and a variation in threshold voltage Vth reaches a certain value or larger resulting in a certain distribution, SNM may not be ensured, that is, cells for which the butterfly curve cannot be provided may probably be present. This probability increases consistently with the capacity of an SRAM, that is, the number of SRAM cells. Data in such cells may be destroyed simply by selecting the word line to turn on the transfer gate. This may disadvantageously prevent the memory from operating correctly.

Various architectures are possible for SRAM arrays. However, for compilable SRAMs which are mixed in ASICs or the like and for which the number of bits and the configuration are freely designed, in view of area efficiency and speed or power performance, arrays are generally configured to be compilable for each I/O as shown in FIG. 11 in order to allow an I/O width to be freely set. In this case, selecting a certain row sets the cell at the cross point between this row and one column selected for each I/O to be an actually selected cell to or from which data is to be written or read. Accordingly, it is necessary that cells located in the same row in which the selected cell is present but for which the columns are unselected have their word lines turned on but are not subjected to data reading or writing, with the data held as it is.

It is assumed that the above SNM of a cell is ineffective. First, for a writing operation, new data is written to a selected cell located in the selected column, eliminating the need for the original data. This in turn eliminates the need to worry about possible data destruction. However, all cells for which the word line is turned on but which are located in unselected columns may be subjected to data destruction. On the other hand, for a reading operation, whether or not the column is selected, data may be destroyed in all the cells for which the word line is turned on. This phenomenon is called disturbance.

To avoid these problems, the control of cell-related voltages has been proposed. For example, description will be given of the proposal in K. Zhang et al., "A 3-GHz 70 Mb SRAM in 65 nm CMOS Technology with Integrated Column-Based Dynamic Power Supply," ISSCC 2005 Digest of Technical Papers, pp. 474-475, 611. The proposal involves varying a power supply voltage VDDC for inverters constituting a flip flop in a cell according to a mode or a column selection state. For a reading operation, the power supply voltage VDDC is set higher than a standard supply voltage VDD. This fixes a "0" node side to an "L" level and increases the driving force of an operating driver (N channel MOS transistor). This is because a gate potential level is set equal to the power supply voltage VDDC, which is higher than the voltage VDD. On the other hand, the word line level and a bit line precharge voltage remains at the voltage VDD level, with the driving force for the transfer gate remaining unchanged. This minimizes a variation in the "L" side node in connection with the butterfly curve, improving the SNM. This in turn improves the disturbance resistance both for a reading operation and for a writing operation.

However, thus setting the power supply voltage VDDC higher than the voltage VDD degrades the writing characteristics. The data in an SRAM cell is rewritten mainly by reducing the level of the "1" side "H" node by means of the "L" level of the bit line via the transfer gate. However, an increase in power supply voltage VDDC improves the driving force of a PMOS transistor that attempts to keeps the level of the "H" node. An improvement in the writing characteristic is contradictory to an increase in SNM and is thus achieved by reducing the power supply voltage VDDC below the voltage VDD instead of setting the power supply voltage VDDC higher than the voltage VDD. As already described, for a writing operation, disturbance must be taken into account for unselected columns. Consequently, the power supply voltage VDDC is similarly set higher than the voltage VDD and is reduced only for selected columns on which a writing operation is to be performed.

This is summarized in FIG. 12. In this case, for a writing operation, the voltage level of the cell power supply voltage VDDC needs to be controlled according to whether or not the column is selected. Thus, not only power is required to charge and discharge the power supply voltage VDDC for each column but charging or discharging also needs to be completed fast enough for an access to the cell. Further, the charging and discharging current, described above, increases and the charging and discharging speed decreases with increasing difference between a sufficiently higher power supply voltage VDDC (>VDD) for avoidance of disturbance and a sufficiently lower power supply voltage VDDC (<VDD) for improved writing characteristic. Consequently, in changing the voltage level of the power supply voltage VDDC, it is desirable to reduce the capacity of the node for charging or discharging and the amount of the change in voltage level in order to reduce required power and to maintain speed performance.

In the example in K. Zhang et al., "A 3-GHz 70 Mb SRAM in 65 nm CMOS Technology with Integrated Column-Based Dynamic Power Supply," ISSCC 2005 Digest of Technical Papers, pp. 474-475, 611, described above, the power supply voltage VDDC is set higher than the voltage VDD in order to avoid disturbance. However, if the disturbance characteristic is not problematic but the writing characteristic may be degraded, then for unselected columns, the power supply voltage VDDC may be set equal to the power VDD level both for a reading operation and for a writing operation, and for selected columns, the power supply voltage VDDC may be lowered only for a writing operation. An example of such a technique is proposed in Masanao Yamaoka et al., "Low-Power Embedded SRAM Modules with Expanded Margins for Writing," ISSCC 2005 Digest of Technical Papers, pp. 480-481, 611. In this case, during a writing operation, the power supply voltage VDDC for a selected column is open-circuit. A write cell discharges current from the power supply voltage VDDC, reducing the voltage level to improve the writing characteristic. However, in this case, after the writing operation, the power supply voltage VDDC is no longer provided to the inverter in the node to be set to the "1" level. This facilitates data inversion for a writing operation but may make cell latching unstable. Further, when a writing operation reduces the power supply voltage VDDC, it is desirable to reduce the capacity of the node for charging or discharging and the amount of the change in voltage level in order to reduce the required power and to maintain speed performance, as described above.

BRIEF SUMMARY OF THE INVENTION

A first aspect of the present invention provides a semiconductor memory device comprising a first inverter and a second inverter which constitute a memory cell and each of which has an input terminal and an output terminal connected crosswise to an output terminal and an input terminal, respectively, of the other; a first power supply control circuit which supplies a first voltage to the first inverter; and a second power supply control circuit which supplies a second voltage to the second inverter, wherein the first and second power supply control circuits control the first and second voltages, respectively, supplied to the first and second inverters in a selected memory cell for a writing operation in accordance with write data.

A second aspect of the present invention provides a semiconductor memory device comprising a memory cell array having memory cells arranged in a matrix, each of the memory cells including a first inverter and a second inverter each having an input terminal and an output terminal connected crosswise to an output terminal and an input terminal, respectively, of the other; a first power supply wire connected to all the first inverters of a plurality of memory cells arranged in a column direction in the memory cell array; a second power supply wire connected to all the second inverters of a plurality of memory cells arranged in a column direction in the memory cell array; and a power supply control circuit which supplies, for a writing operation, one of a first voltage and a second voltage to each of the first power supply wire and the second power supply wire in accordance with write data for a selected memory cell in the memory cell array, wherein to write "1" to the selected memory cell, an output node of the first inverter in the memory cell is set to a high level, and to write "0" to the selected memory cell, an output node of the second inverter in the memory cell is set to a high level, and the power supply control circuit supplies the second power supply wire with the first voltage and the first power supply wire with the second voltage higher than the first voltage, in order to write "1" to the selected memory cell, and supplies the first power supply wire with the first voltage and the second power supply wire with the second voltage higher than the first voltage, in order to write "0" to the selected memory cell.

BRIEF DESCRIPTION OF THE SEVERAL VIEWS OF THE DRAWING

FIG. 1 is a circuit diagram showing the configuration of an SRAM cell in accordance with a first embodiment of the present invention;

FIG. 2 is a circuit diagram showing an example of voltage control in the SRAM cell in accordance with the first embodiment;

FIG. 3 is a circuit diagram showing the detailed configuration of a semiconductor memory device in accordance with the first embodiment;

FIG. 5 is a circuit diagram showing the detailed configuration of a semiconductor memory device in accordance with a second variation of the first embodiment;

FIG. 7A is a diagram showing the layout of a cell array in which the same power supply wire is used for a right inverter and a left inverter within the same column;

FIG. 7B is a diagram showing the layout of a cell array in which different power supply wires are used for the right and left inverters within the same column;

FIG. 9 is a circuit diagram showing the configuration of a semiconductor memory device in accordance with a second embodiment of the present invention;

DETAILED DESCRIPTION OF THE INVENTION

Figure 4:
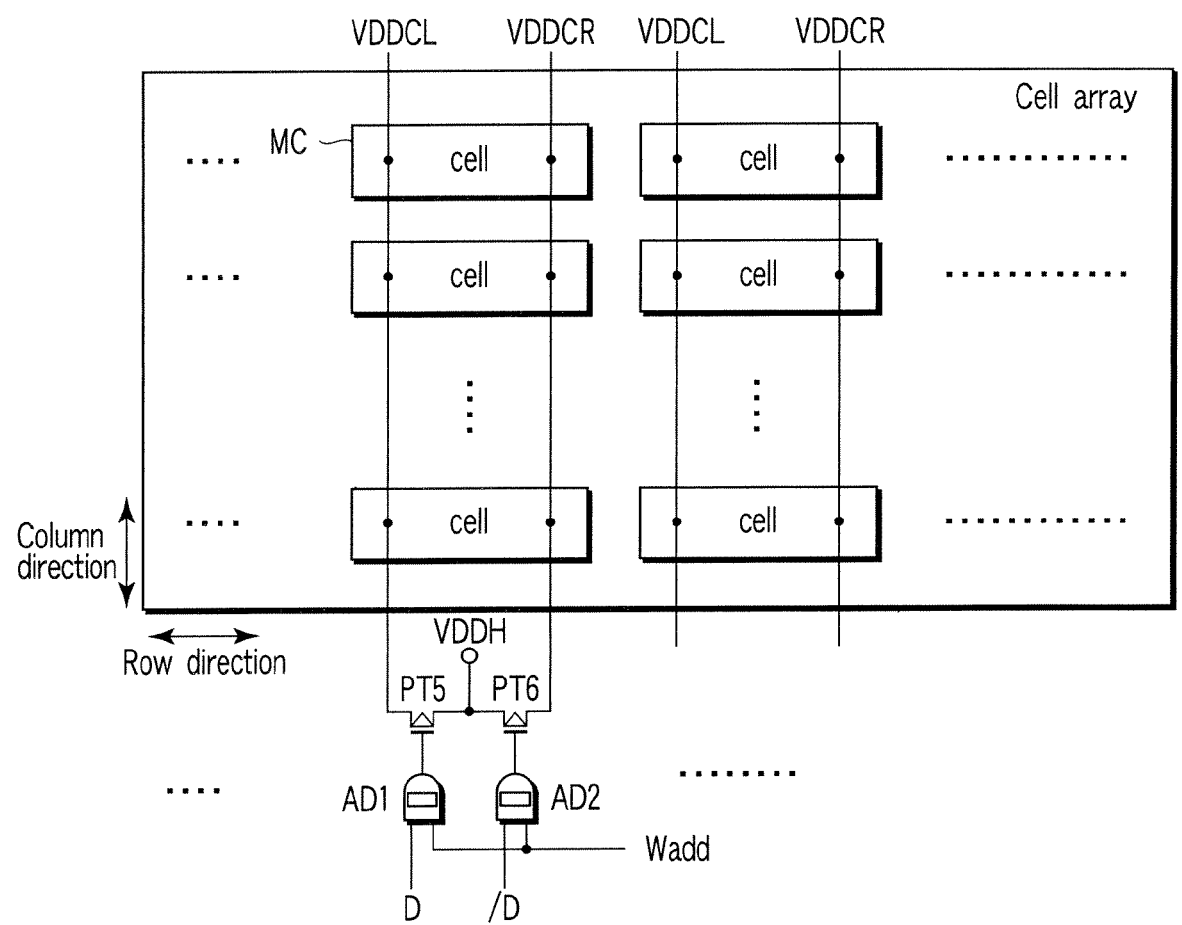
FIG. 4 is a circuit diagram showing the detailed configuration of a semiconductor memory device in accordance with a first variation of the first embodiment.

Embodiments of the present invention will be described below with reference to the drawings. In the description, like components are denoted by like reference numerals throughout the drawings.

In order to avoid disturbance, one of the above conventional examples sets the power supply voltage VDDC higher than the standard supply voltage VDD, and the other does not set the power supply voltage VDDC higher than the standard supply voltage VDD. According to the embodiments of the present invention, either of these methods may be used. Here, focus is given to the manner of reducing a voltage supplied to a selected column for a writing operation. For simplification, in the examples described below, VDDC=VDD, as in the case of the latter of the above conventional methods. However, the present invention is also applicable to the case where VDDC>VDD in exactly the same manner.

First Embodiment

First, description will be given of a semiconductor memory device having SRAM cells in accordance with a first embodiment of the present invention. FIG. 1 is a circuit diagram showing the configuration of the SRAM cell in accordance with the first embodiment.

This SRAM cell comprises a first inverter circuit and a second inverter circuit, transfer gate transistors PL and PR, and a first power supply control circuit 11 and a second power supply control circuit 12. The first inverter circuit comprises a load transistor LL composed of a P channel MOS transistor (hereinafter referred to as a PMOS transistor) and a driver transistor DL composed of an N channel MOS transistor (hereinafter referred to as an NMOS transistor). A drain of the load transistor LL is connected to a drain of the driver transistor DL. A source of the load transistor LL is supplied with a power supply voltage VDDCL from the first power supply control circuit 11. A source of the driver transistor DL is supplied with a reference voltage (for example, a ground voltage) VSSC.

The second inverter circuit comprises a load transistor LR composed of a PMOS transistor and a driver transistor DR composed of an NMOS transistor. A drain of the load transistor LR is connected to a drain of the driver transistor DR. A source of the load transistor LR is supplied with a power supply voltage VDDCR from the second power supply control circuit 12. A source of the driver transistor DR is supplied with the reference voltage VSSC.

An output node of the first inverter, comprising the transistors LL and DL, is connected to an input node of the second inverter, comprising the transistors LR and DR, and to a bit line BL via a current passage through the transfer gate transistor PL. An output node of the second inverter is connected to an input node of the first inverter and to a bit line /BL to which signals complementary to those for the bit line BL is supplied, via a current passage through the transfer gate transistor PR. Further, a word line WL is connected to gates of the transfer gate transistors PL and PR.

Now, description will be given of the operation of the SRAM cell in accordance with the first embodiment.

In a reading operation and a writing operation in the above conventional example, the power supply voltage VDDC supplied to the inverter of the SRAM cell needs to be reduced only for a selected column corresponding to a write target. This is intended to improve the writing characteristic. Moreover, in the conventional example, the power supply voltages VDDC supplied to the right and left inverters of the SRAM cell have their levels equally controlled. However, this is not required if the only purpose is to improve the writing characteristic. That is, for a node that inverts data from 1 to 0, a reduction in power supply voltage VDDC is advantages for rewriting of the node and is required as described above. However, for the other node that changes from 0 to 1, the power supply voltages need not be reduced. Rather, keeping a higher power supply voltage VDDC is advantageous for a data change. Thus, the power supply voltage VDDC need not be reduced for both the right and left inverters but for only one of them. Whether the power supply voltage VDDC is to be reduced for the right or left inverter may be determined according to data to be written to the column.

According to the first embodiment, the power supply voltage VDDCR supplied to the second inverter circuit in the node to which "1" is to be written is not reduced but is set the same as the standard supply voltage VDD as shown in FIG. 2. On the other hand, the power supply voltage VDDCL supplied to the first inverter circuit in the node to which "0" is to be written is reduced below the voltage VDD. Thus, only one of the power supply voltages supplied to the right and left inverters of the cell, that is, the power supply voltage VDDCL, is controlled according to the data written to the column. This keeps the power supply voltage VDDCR for the node to which the "1" is to be written, higher than the power supply voltage VDDCL. This improves the writing characteristic compared to the case where the power supply voltage VDDC is reduced for both inverters as described in the conventional example.

The thus improved writing characteristic enables a reduction in the voltage level by which the power supply voltage VDDCL or VDDCR is reduced. This reduces a voltage change, enabling a reduction in power required to charge or discharge the power supply voltage VDDCL or VDDCR for the write column. For a writing operation, the voltage level needs to be changed only for a selected column. Consequently, the improved speed characteristic based on reduced charging and discharging time has a significant effect on the speed of the operation of the SRAM cell, that is, a writing operation. Further, obviously, if the speed characteristic of a writing operation hampers an improvement in the speed performance of a chip (semiconductor memory device), an improved writing characteristic improves the speed characteristic of the chip.

Further, the power supply needs to be charged and discharged for only one of the right and left inverters instead of both of them. This requires only a small parasitic capacity for the power supply node for charging and discharging, reducing the required power. As described below, if the originally separate power supply voltage wires VDDCR and VDDCL are used to supply power to the right and left inverters, respectively, the number of wires included in each power supply wire, that is, an upper wire and a lower wire, and the parasitic capacity between adjacent nodes are reduced to half. FIG. 3 shows the configuration of such a semiconductor memory device.

FIG. 3 is a circuit diagram showing the detailed configuration of a semiconductor memory device in accordance with the first embodiment. FIG. 3 shows that different switch circuits, for example, PMOS transistors, are used to switch the power supply voltage VDDC (power supply voltage VDDCL or VDDCR) to a reading high voltage VDDH (in this example, =VDD) and to a writing low voltage VDDL, respectively. The low voltage VDDL is lower than the voltage VDD.

As shown in FIG. 3, a data signal D is input to a first input terminal of a NAND circuit ND1. A write selection signal Wadd is input to a second input terminal of the NAND circuit ND1. A data signal /D that is complementary to the data signal D is input to a first input terminal of a NAND circuit ND2. The write selection signal Wadd is input to a second input terminal of the NAND circuit ND2. An output signal from the NAND circuit ND1 is input to a gate of a PMOS transistor PT1 and to a gate of a PMOS transistor PT2 via an inverter IV1. An output signal from the NAND circuit ND2 is input to a gate of a PMOS transistor PT3 and to a gate of a PMOS transistor PT4 via an inverter IV2.

One end of a current passage through the PMOS transistor PT1 is connected to one end of a current passage through the PMOS transistor PT2. A power supply wire VDDCL is connected to the connection point between the PMOS transistors PT1 and PT2. SRAM column cells MC are arranged in a matrix in a column direction and in a row direction. The power supply wire VDDCL is connected to one of the inverters in each of the plurality of SRAM cells MC arranged in the column direction. Further, one end of a current passage through the PMOS transistor PT3 is connected to one end of a current passage through the PMOS transistor PT4. A power supply wire VDDCR is connected to the connection point between the PMOS transistors PT3 and PT4. The power supply wire VDDCR is connected to the other inverter in each of the plurality of SRAM cells MC arranged in the column direction.

The write selection signal Wadd is set to an "H" level when that column is selected for a write operation, that is, when a writing signal enables a writing operation and an address signal selects the column. When the write selection signal Wadd is set to the "H" level, the data signal D is set to the "H" level, and the data signal /D is set to an "L" level, the output signal from the NAND circuit ND1 is set to the "L" level and the output signal from the NAND circuit ND2 is set to the "H" level. Setting the output signal from the NAND circuit ND1 to the "L" level turns on the PMOS transistor PT1 and turns off the PMOS transistor PT2. This allows the low voltage VDDL to be supplied to the power supply wire VDDCL and to one of the inverters in each SRAM cell MC as a power supply. Further, setting the output signal from the NAND circuit ND2 to the "H" level turns off the PMOS transistor PT3 and turns on the PMOS transistor PT4. This allows the high voltage VDDH to be supplied to the power supply wire VDDCR and to the other inverter in each SRAM cell MC as a power supply.

FIG. 4 is a circuit diagram showing the detailed configuration of a semiconductor memory device in accordance with a first variation of the first embodiment. FIG. 4 shows an example in which the high voltage VDDH, supplied to the right or left inverter of the SRAM cell MC, is disconnected by the switch circuits, that is, PMOS transistors PT5 and PT6.

As shown in FIG. 4, the data signal D is input to a first input terminal of an AND circuit AD1. The write selection signal Wadd is input to a second input terminal of the AND circuit AD1. The data signal /D is input to a first input terminal of an AND circuit ND2. The write selection signal Wadd is input to a second input terminal of the AND circuit AD2. An output signal from the AND circuit AD1 is input to a gate of the PMOS transistor PT5. An output signal from the AND circuit AD2 is input to a gate of the PMOS transistor PT6.

One end of a current passage through the PMOS transistor PT5 is connected to one end of a current passage through the PMOS transistor PT6. The power supply wire VDDH is connected to the connection point between the PMOS transistors PT5 and PT6. The power supply wire VDDCL is connected to the other end of a current passage through the PMOS transistor PT5. The power supply wire VDDCR is connected to the other end of a current passage through the PMOS transistor PT6. The power supply wire VDDCL is connected to one of the inverters in each of the plurality of SRAM cells MC arranged in the column direction. The power supply wire VDDCR is connected to the other inverter in each of the plurality of SRAM cells MC arranged in the column direction.

In the circuit configured as described above, when the write selection signal Wadd is set to the "H" level, the data signal D is set to the "H" level, and the data signal /D is set to the "L" level, the output signal from the AND circuit AD1 is set to the "H" level and the output signal from the AND circuit AD2 is set to the "L" level. This turns off the PMOS transistor PT5, while turning on the PMOS transistor PT6. Thus, the high voltage VDDH is supplied to the power supply wire VDDCR and to the other inverter in the SRAM cell MC as a power supply. On the other hand, the supply of the high voltage VDDH to the power supply wire VDDCL is blocked.

In this case, the cell node for which the supply of the high voltage VDDH is open is set to the "L" level via the bit line. This causes the high voltage VDDH, initially set to the "H" level, to be discharged to lower its level. Consequently, the voltage level shifts in a direction in which the writing characteristic is improved. However, the parasitic capacity of the power supply wire keeps the voltage level of the power supply wire VDDCL, to which the open-circuit high voltage VDDH has been supplied, at an intermediate potential at least while the word line is open-circuit, in spite a possible decrease in the voltage level. This prevents the latching of the cell from being disrupted. Unlike the reference voltage VSSC for the cell, the high voltage VDDH does not constitute a reading current path but is used to keep an "H" node in the cell. Thus, the parasitic resistance of the power supply path for the high voltage VDDH has only a small effect. Therefore, control switches for switching the high voltage VDDH as shown in FIG. 3 only insignificantly affects the SRAM performance.

Compared to equally changing the levels of the power supply voltages VDDC for the right and left inverters, control for switching the power supply for only one of the inverters according to write data requires an increase in power. However, even in the conventional example, only the control based on a data signal that reaches the column control section is added to the originally provided switch for the power supply voltage VDDC. The required power and area need to be increased only by small amounts in order to drive the gate capacity for the switch. On the other hand, the power supply wire for the power supply voltage VDDC is connected to all the SRAM cells arranged in the column direction in the cell array. Charging and discharging this capacity is generally at a much higher level. If the high voltage VDDH is at a higher level than the standard supply voltage VDD, the inverters in the column control section in FIG. 3 may be provided with a function for shifting to the high voltage VDDH.

The first variation shown in FIG. 4 has the advantage of being able to reduce the scale of the controlling circuit compared to the circuit shown in FIG. 3.

FIG. 5 is a circuit diagram showing the detailed configuration of a semiconductor memory device in accordance with a second variation of the first embodiment. FIG. 5 shows an example in which a function for, when the high voltage VDDH lowers, clamping the high voltage VDDH at a certain voltage level is added to the configuration shown in FIG. 4.

A switch comprising NMOS transistors NT1 and NT2 is provided in parallel with a switch comprising the PMOS transistors PT5 and PT6. If one of the PMOS transistors is turned off, when the voltage of the power supply wire VDDCL or VDDCR decreases by at least a threshold for the NMOS transistors from a gate input level (H), the NMOS transistors are turned on to clamp the voltage of the power supply wire VDDCL or VDDCR to prevent the voltage from further decreasing. This is effective if an excessive decrease in the voltage of the power supply wire VDDCL or VDDCR affects the power and time required for the charging and discharging of the high voltage VDDH.

In the same column in the cell array, different wires may be used for the right and left inverters or the same wire may be used for both inverters. In the present embodiment, it is assumed that in the same column, different wires are used for the right and left inverters.

Figure 6:
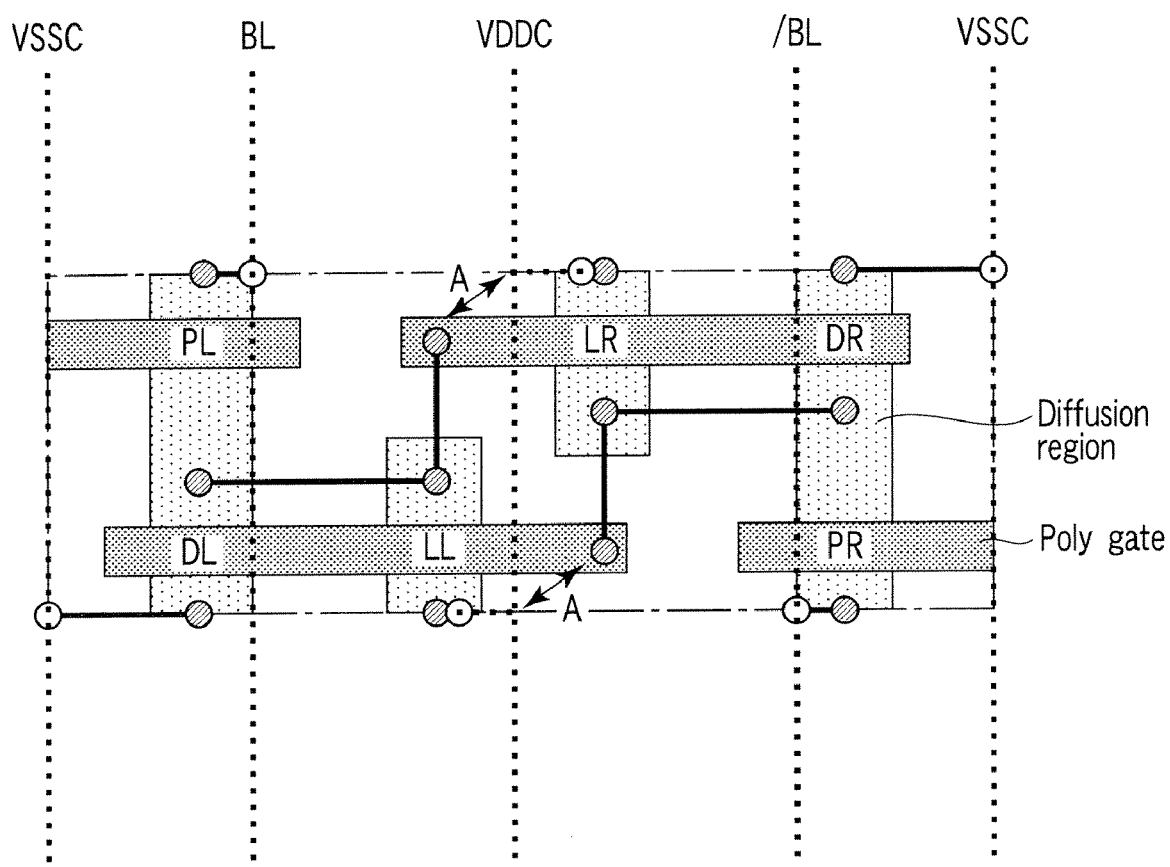
FIG. 6 is a diagram showing the base layout of the SRAM cell and an example of connections of array wires.

FIG. 6 shows the base layout of an SRAM cell and an example of connections of array wires. FIG. 6 shows PMOS transistors (load transistors LL and LR) corresponding to a right inverter and a left inverter, in its center. The power supply wire VDDC is connected to the sources of the PMOS transistors. Thus, in the conventional example, since the right and left power supply wires VDDC constitute the same node, the power supply wire VDDC can be connected to both transistors.

With respect to this connection, in a miniaturized cell, a branch wire is formed in a piece of second layer metal located in the center, as a power supply wire VDDC. The branch wire is then extended rightward and leftward so as to connect to the sources of the PMOS transistors. This is because an attempt to connect, via first layer metal, the sources of the PMOS transistors to the area located immediately below the central second layer metal causes the first layer metal to be disadvantageously located very close to contacts on the gates of the transistors, as shown by A in FIG. 6. In this case, the layout of the second layer metal is as shown in FIG. 7A. However, in this case, the power supply wire VDDC in the second layer metal is connected to each of the sources of the right and left PMOS transistors, resulting in a recessed and projecting wire. If miniaturization evolves and in particular, the pitch is extremely small and a plurality of wires are installed in one direction as in the case of cell arrays, it is difficult to process recessed and projecting wires such as the one shown in FIG. 7A. This is because it is more likely that a proximity effect during exposure prevents accurate machining, that is, projections form short-circuits or recesses form open-circuits, or inappropriately short projections result in improper contacts between the sources of the PMOS transistors and the power supply wire. This results in additional restrictions; for example, the line interval must be set larger than that specified in the minimum design rule.

Therefore, to arrange very thin wires at a small pitch, it is easier to arranged the dependent right and left power supply wires VDDC in a regular vertical configuration together with other lines including bit lines BL and /BL and the reference voltage wire VSSC. This allows wiring to be formed at the minimum pitch. Thus, even though the number of the wires shown in FIG. 7B is larger than that of the wires shown in FIG. 7A, by one, the total cell width may be reduced and this trend has become more significant as miniaturization improves. In an SRAM cell in which the originally separate power supply wires VDDC are used for the right and left inverters, respectively, as shown in FIG. 7B, the present embodiment can be implemented without the need to change the cell area or the wiring in the array.

Second Embodiment

Now, description will be given of a semiconductor memory device having SRAM cells in accordance with a second embodiment of the present invention. Components of this semiconductor memory device which are similar to those in the configuration in accordance with the first embodiment are denoted by the same reference numerals as those in the first embodiment. The description of these components is omitted.

In the example described in the first embodiment, the power supply wires VDDCL and VDDCR for the two inverters in the SRAM cell are independently controlled. However, in the second embodiment, description will be given of the independent control of the reference voltage VSSC for the two inverters. In the cell layouts shown in FIGS. 7A and 7B, the separate reference voltage wires VSSC are connected to the right and left inverters in each cell. However, each reference voltage wire VSSC is shared by laterally adjacent cells.

Figure 8A:
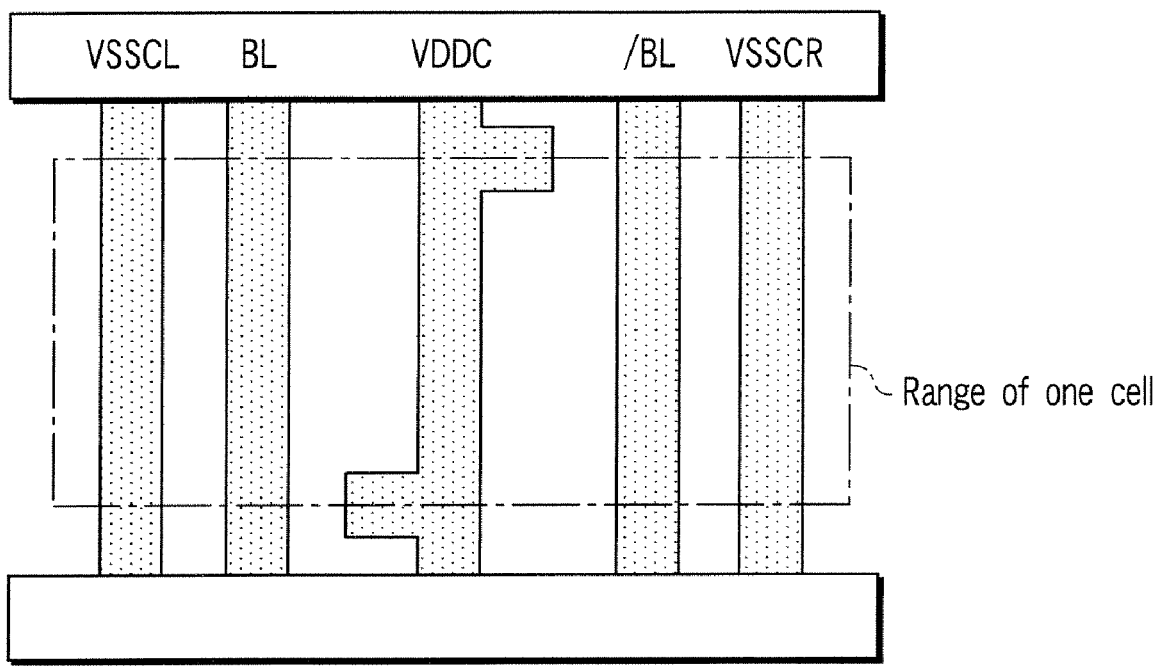
FIGS. 8A and 8B are diagrams showing the layout of a cell array in which each of the reference voltage wires for the right and left inverters within the column is separated between adjacent cells.
Figure 8B:
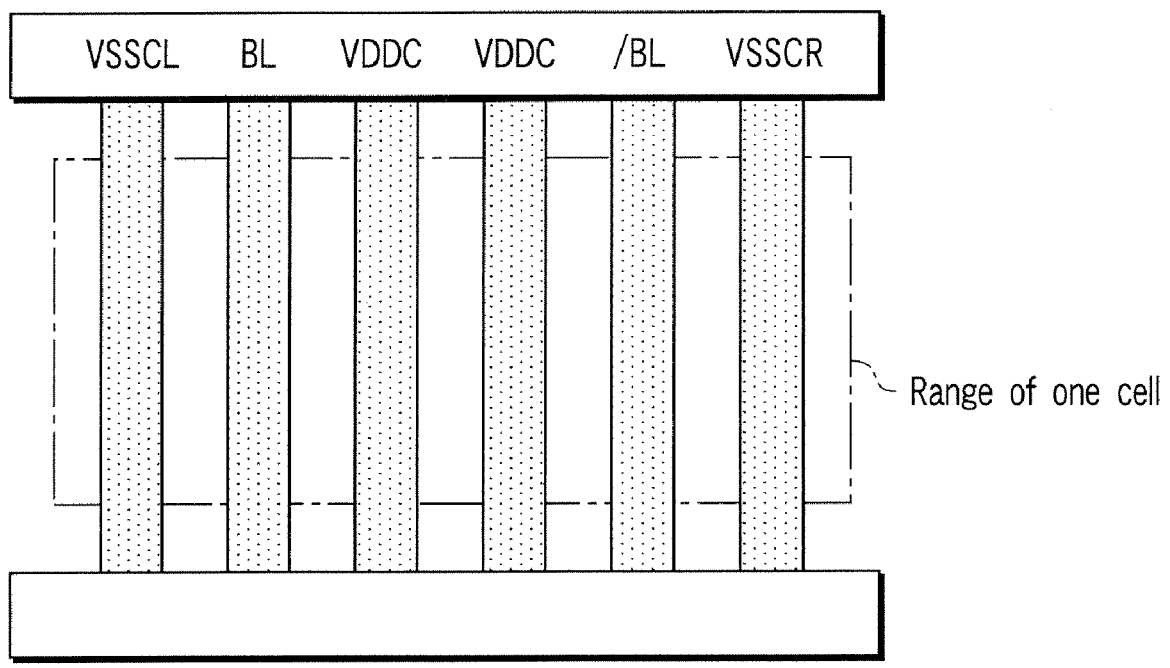

However, in some cells, driver transistors or transfer gate transistors comprising NMOS transistors have a larger transistor width (W) in order to ensure an appropriate cell current. This corresponds to the configuration in FIG. 6 in which the driver transistors DR and DL and the transfer gate transistors PR and PL have increased diffusion area widths. In this case, the increased transistor width (W) correspondingly increases the cell width, resulting in a layout in which adjacent cells have the separate reference voltage wires VSSC, as shown in FIGS. 8A and 8B.

FIG. 9 is a circuit diagram showing the configuration of a semiconductor memory device in accordance with a second embodiment. FIG. 9 also shows a configuration in which the reference voltages VSSCL and VSSCR for the two inverters in each of the SRAM cells in a selected column are independently controlled.

As shown in FIG. 9, the data signal /D is input to the first input terminal of the NAND circuit ND1. The write selection signal Wadd is input to the second input terminal of the NAND circuit ND1. The data signal D is input to the first input terminal of the NAND circuit ND2. The write selection signal Wadd is input to the second input terminal of the NAND circuit ND2. The output signal from the NAND circuit ND1 is input to a gate of an NMOS transistor NT3 and to a gate of an NMOS transistor NT4 via the inverter IV1. The output signal from the NAND circuit ND2 is input to a gate of an NMOS transistor NT5 and to a gate of an NMOS transistor NT6 via the inverter IV2.

One end of a current passage through the NMOS transistor NT3 is connected to one end of a current passage through the NMOS transistor NT4. The reference voltage wire VSSCL is connected to the connection point between the NMOS transistors NT3 and NT4. The SRAM column cells MC are arranged in a matrix in the column direction and in the row direction. The power supply wire VSSCL is connected to one of the inverters in each of the plurality of SRAM cells MC arranged in the column direction. Further, one end of a current passage through the NMOS transistor NT5 is connected to one end of a current passage through the NMOS transistor NT6. The reference voltage wire VSSCR is connected to the connection point between the NMOS transistors NT5 and NT6. The power supply wire VSSCR is connected to the other inverter in each of the plurality of SRAM cells MC arranged in the column direction.

In the circuit configured as described above, when the write selection signal Wadd is set to the "H" level, the data signal /D is set to the "L" level, and the data signal D is set to an "H" level, the output signal from the NAND circuit ND1 is set to the "H" level and the output signal from the NAND circuit ND2 is set to the "L" level. Setting the output signal from the NAND circuit ND1 to the "H" level turns on the NMOS transistor NT3 and turns off the NMOS transistor NT4. This allows the reference voltage VSSC to be supplied to the reference voltage wire VSSCL and to one of the inverters in each SRAM cell MC as a power supply. Further, setting the output signal from the NAND circuit ND2 to the "L" level turns off the NMOS transistor NT5 and turns on the NMOS transistor NT6. This allows the reference voltage VSSH to be supplied to the reference voltage wire VSSCR and to the other inverter in each SRAM cell MC as a power supply. The reference voltage VSSH is higher than the reference voltage VSSC.

In this case, as is the case with the first embodiment, the power supply voltages VDDCL and VDDCR ensure a disturbance resistance, while enabling the reference voltage wires VSSCL and VSSCR connected to the right and left inverters in the selected column to be independently controlled according to write data. That is, the voltage level of the reference voltage is increased only for the inverter that inverts the data from 0 to 1, to enable the improvement of the writing characteristic only of each of the SRAM cells in the selected column.

Third Embodiment

Now, description will be given of a semiconductor memory device having SRAM cells in accordance with a third embodiment of the present invention. Components of this semiconductor memory device which are similar to those in the configuration in accordance with the first embodiment are denoted by the same reference numerals as those in the first embodiment. The description of these components is omitted.

In the example described in the second embodiment, description has been given of the control of the reference voltage VSSC performed when the separate reference voltages VSSC are provided for the respective adjacent cells. Now, description will be given of an example in which the reference voltage wire VSSC is shared by adjacent cells and in which the reference voltage VSSC is controlled by a data signal, as shown in FIG. 7. In the first and second embodiments described above, it is assumed that the power supply voltage VDDCL or VDDCR is increased to improve the disturbance resistance, while the degraded writing characteristic, which may result from the improved disturbance resistance, is improved by controlling the cell power supply. However, in spite of sufficient disturbance resistance, some SRAM cells have an improper writing characteristic, which needs to be improved, owing to the characteristics and dimensions of the transistors constituting the SRAM cell. The third embodiment takes these SRAM cells into account and shows an example in which the reference voltage wire VSSC shared by adjacent cells is controlled according to write data. This control is effective for improving the writing characteristic of a selected column.

Now, it is assumed that in an unselected column, with one of the reference voltages VSSC raised, the word line is selected. In this state, the increased reference voltage VSSC correspondingly degrades the disturbance resistance. However, as described above, even in this state, the characteristics and dimensions of the transistors constituting the SRAM cell keep the degradation of the disturbance resistance at an unproblematic level. That is, the bit line is precharged to the "H" level, so that with the reference voltage VSSC of the "0" level node raised, the transfer gate transistor is turned on. However, this does not invert the "0" level to the "1" level. In this case, the reference voltage VSSC for unselected columns can have its level controlled as in the case of selected columns without posing any problem.

Figure 10:
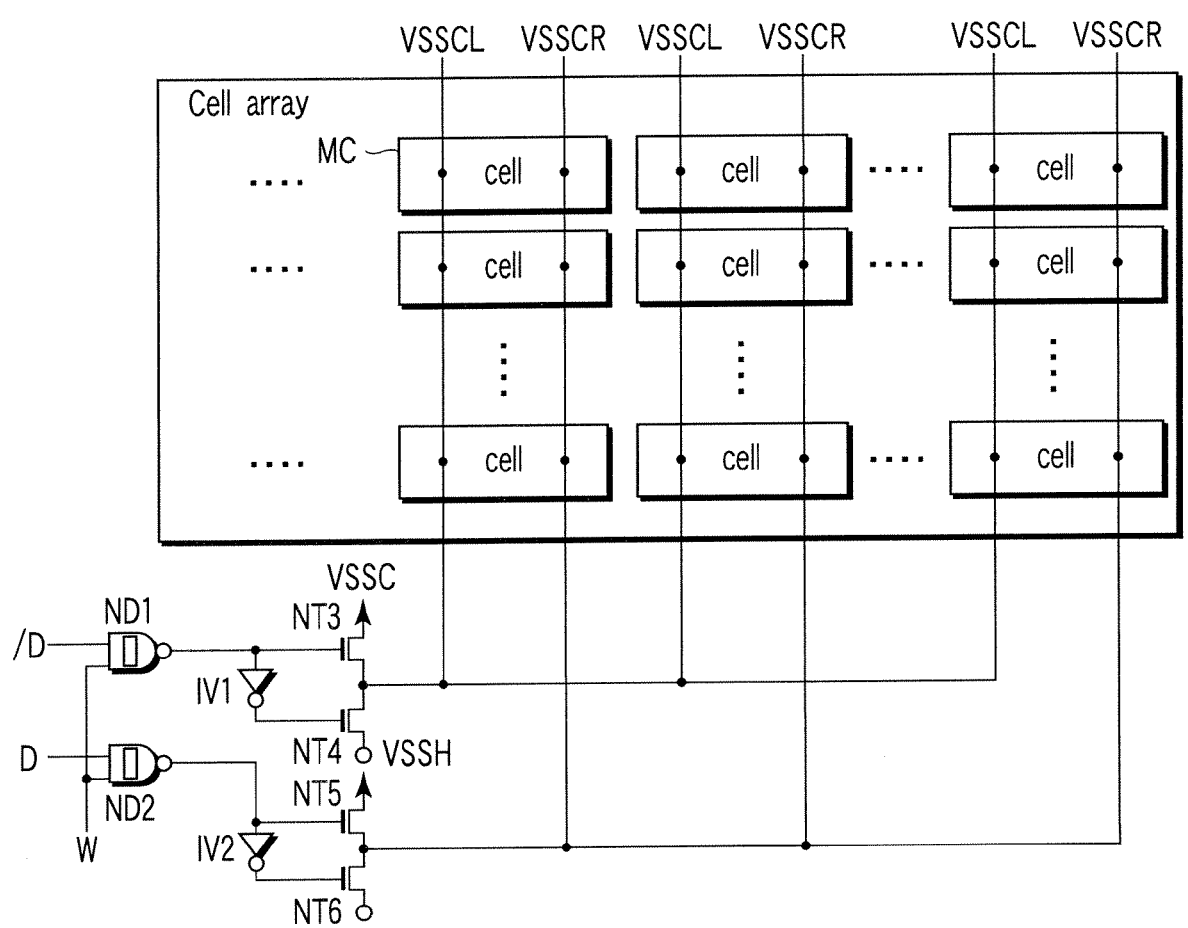
FIG. 10 is a circuit diagram showing the configuration of a semiconductor memory device in accordance with a third embodiment of the present invention.
Figures 11, 12:
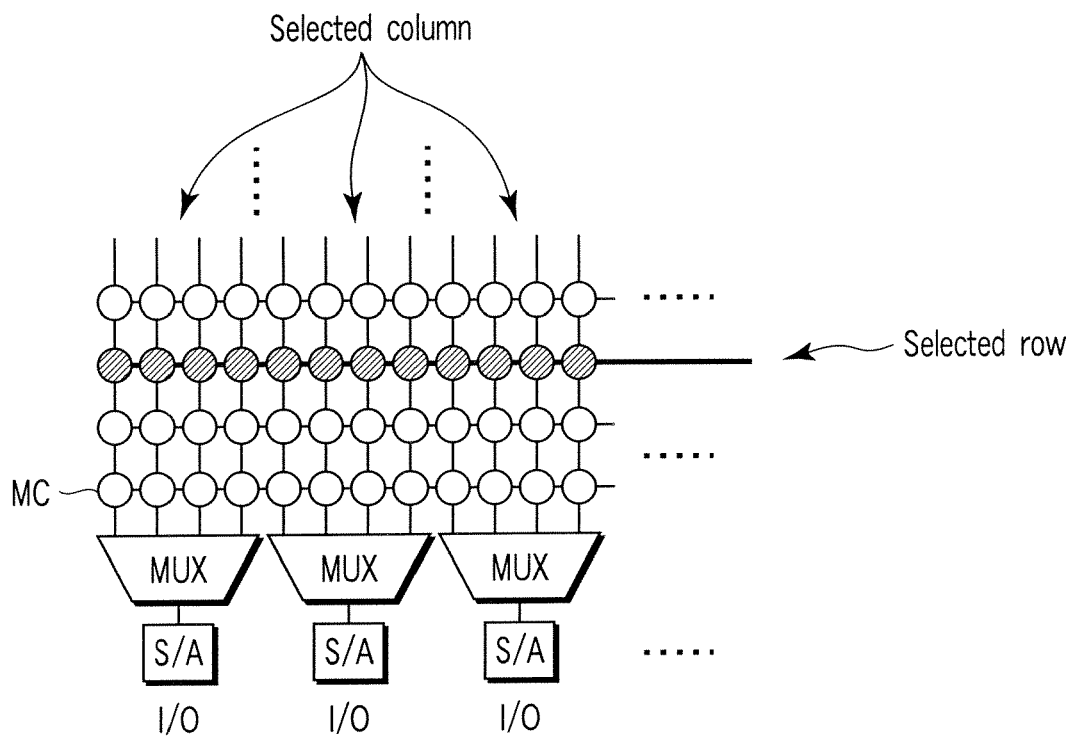
FIG. 11 is a diagram showing the configuration of a cell array in SRAM.
FIG. 12 is a diagram showing voltage control for selected columns and unselected columns during a reading operation and during a writing operation.

FIG. 10 is a circuit diagram showing the configuration of the semiconductor memory device in accordance with the third embodiment. FIG. 10 shows a configuration in which the reference voltages VSSC for selected columns and for unselected columns are equally controlled.

As shown in FIG. 10, the data signal /D is input to the first input terminal of the NAND circuit ND1. A write signal W is input to the second input terminal of the NAND circuit ND1. The data signal D is input to the first input terminal of the NAND circuit ND2. The write signal W is input to the second input terminal of the NAND circuit ND2. The output signal from the NAND circuit ND1 is input to the gate of the NMOS transistor NT3 and to the gate of the NMOS transistor NT4 via the inverter IV1. The output signal from the NAND circuit ND2 is input to the gate of the NMOS transistor NT5 and to the gate of the NMOS transistor NT6 via the inverter IV2.

In the cell array, the SRAM column cells MC are arranged in a matrix in the column direction and in the row direction. The reference voltage wire VSSCL is connected to one of the inverters in each of the plurality of SRAM cells MC arranged in the same column. The reference voltage wire VSSCL is connected to the connection point between one end of the current passage through the NMOS transistor NT3 and one end of the current passage through the NMOS transistor NT4. Further, the reference voltage wire VSSCR is connected to the other inverter in each of the plurality of SRAM cells MC arranged in the same column. The reference voltage wire VSSCR is connected to the connection point between one end of the current passage through the NMOS transistor NT5 and one end of the current passage through the NMOS transistor NT6. Moreover, the reference voltage VSSC is supplied to the other end of each of the NMOS transistors NT3 and NT5. The reference voltage VSSH is supplied to the other end of each of the NMOS transistors NT4 and NT6.

In the circuit configured as described above, when the write signal W is set to the "H" level, the data signal /D is set to the "L" level, and the data signal D is set to an "H" level, the output signal from the NAND circuit ND1 is set to the "H" level and the output signal from the NAND circuit ND2 is set to the "L" level. Setting the output signal from the NAND circuit ND1 to the "H" level turns on the NMOS transistor NT3 and turns off the NMOS transistor NT4. This allows the reference voltage VSSC to be supplied to the reference voltage wire VSSCL and to one of the inverters in each SRAM cell MC as a power supply. Further, setting the output signal from the NAND circuit ND2 to the "L" level turns off the NMOS transistor NT5 and turns on the NMOS transistor NT6. This allows the reference voltage VSSH to be supplied to the reference voltage wire VSSCR and to the other inverter in each SRAM cell MC as a power supply.

As described above, such a configuration as shown in FIG. 10 only requires the reference voltage VSSC for all the columns to be controlled according to the write data (data signals D and /D) regardless of address signals for column selection. Thus, each of the reference voltage wires VSSCL and VSSCR may be connected to all the columns in the cell array so that for a writing operation, the reference voltages VSSCL and VSSCR can be controlled according to the write data. This simplifies the control circuit. In a selected column, one of the reference voltages VSSCL and VSSCR has its level varied so as to improve the writing characteristic. As a result, the writing characteristic is improved. Thus, controlling the level of one of the reference voltages VSSCL and VSSCR according to the write data is also effective on cells sharing the reference voltage wires VSSCL and VSSCR with the cells in the adjacent column.

As described above, the embodiments of the present invention propose a technique for SRAM cells which is based on voltage control for cell arrays and which enables the improvement both of the noise margin and disturbance resistance during a reading operation and a writing operation, which are expected to be degraded by miniaturization and reduced voltages, and of the writing characteristic, which is in a tradeoff relationship with the noise margin and disturbance resistance. That is, the embodiments of the present invention can provide a solution for preventing possible disturbance that may cause a variation in the static noise margin among SRAM cells and the resulting data destruction as a result of an increase in variation in threshold voltage Vth and the like associated with reduced voltages and miniaturization, while avoiding a degraded writing characteristic, which may be caused by the prevention of the disturbance. Specifically, for example, for a writing operation, the power supply level is independently controlled for the right and left inverters in each of the SRAM cells in the selected column.

The embodiments of the present invention can provide a semiconductor memory device that enables the improvement both of the resistance to disturbance that may result from variations in threshold voltage and the like or reduced voltages and of the writing characteristic, the semiconductor memory device being further capable of inhibiting an increase need for power and degraded speed characteristic, which may result from the above improvements.

The above embodiments can be implemented not only independently but also in combination. Moreover, each of the above embodiments contains various levels of inventions. The various levels of inventions can thus be extracted by appropriately combining a plurality of the components disclosed in each embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
a first inverter and a second inverter which constitute a memory cell and each of which has an input terminal and an output terminal connected crosswise to an output terminal and an input terminal, respectively, of the other;
a first power supply control circuit which supplies a first voltage to the first inverter; and
a second power supply control circuit which supplies a second voltage to the second inverter, wherein the first and second power supply control circuits control the first and second voltages, respectively, supplied to the first and second inverters in a selected memory cell for a writing operation in accordance with write data, the first power supply control circuit includes a first MOS transistor, a second MOS transistor, a third inverter, and a first NAND circuit, the first inverter is connected to a node where one end of a current passage through the first MOS transistor is connected to one end of a current passage through the second MOS transistor, the first voltage is supplied to the other end of the current passage through the first MOS transistor, and the second voltage is supplied to the other end of the current passage through the second MOS transistor, an output terminal of the first NAND circuit is connected to a gate of the first MOS transistor and to a gate of the second MOS transistor via the third inverter, the second power supply control circuit includes a third MOS transistor, a fourth MOS transistor, a fourth inverter, and a second NAND circuit, the second inverter is connected to a node where one end of a current passage through the third MOS transistor is connected to one end of a current passage through the fourth MOS transistor, the first voltage is supplied to the other end of the current passage through the third MOS transistor, and the second voltage is supplied to the other end of the current passage through the fourth MOS transistor, and an output terminal of the second NAND circuit is connected to a gate of the third MOS transistor and to a gate of the fourth MOS transistor via the fourth inverter.

2. The semiconductor memory device according to claim 1, wherein, when a writing operation sets an output node of the first inverter to a low level, the first power supply control circuit supplies the first inverter with the first voltage lower than the second voltage supplied to the second inverter by the second power supply control circuit.

3. The semiconductor memory device according to claim 2, wherein the first and second power supply control circuits use, as the second voltage, all of a voltage supplied to one of the first and second inverters for a reading operation, a voltage supplied to one of the first and second inverters in an unselected column for a writing operation, and a voltage supplied to one of the first inverter and the second inverter in a selected column in which a writing operation sets the output node to a high level.

4. The semiconductor memory device according to claim 1, wherein, when a writing operation sets an output node of the first inverter to a low level, the first power supply control circuit blocks the first voltage supplied to the first inverter.

5. A semiconductor memory device, comprising:
a first inverter and a second inverter which constitute a memory cell and each of which has an input terminal and an output terminal connected crosswise to an output terminal and an input terminal, respectively, of the other;
a first power supply control circuit which supplies a first voltage to the first inverter; and
a second power supply control circuit which supplies a second voltage to the second inverter, wherein the first and second power supply control circuits control the first and second voltages, respectively, supplied to the first and second inverters in a selected memory cell for a writing operation in accordance with write data, the first power supply control circuit includes a first p-channel MOS transistor, a second p-channel MOS transistor, a third inverter, and a first NAND circuit, the first inverter is connected to a node where a drain of the first p-channel MOS transistor is connected to a drain of the second p-channel MOS transistor, the first voltage is supplied to a source of the first p-channel MOS transistor, and the second voltage is supplied to a source of the second p-channel MOS transistor, the first voltage having a lower voltage level than the second voltage, an output terminal of the first NAND circuit is connected to a gate of the first p-channel MOS transistor and to a gate of the second p-channel MOS transistor via the third inverter, the second power supply control circuit includes a third p-channel MOS transistor, a fourth p-channel MOS transistor, a fourth inverter, and a second NAND circuit, the second inverter is connected to a node where a drain of the third p-channel MOS transistor is connected to a drain of the fourth p-channel MOS transistor, the first voltage is supplied to a source of the third p-channel MOS transistor, the second voltage is supplied to a source of the fourth p-channel MOS transistor, and an output terminal of the second NAND circuit is connected to a gate of the third p-channel MOS transistor and to a gate of the fourth p-channel MOS transistor via the fourth inverter.

6. The semiconductor memory device according to claim 5, wherein, when a writing operation sets an output node of the first inverter to a low level, the first power supply control circuit supplies the first inverter with the first voltage lower than the second voltage supplied to the second inverter by the second power supply control circuit.

7. The semiconductor memory device according to claim 6, wherein the first and second power supply control circuits use, as the second voltage, all of a voltage supplied to one of the first and second inverters for a reading operation, a voltage supplied to one of the first and second inverters in an unselected column for a writing operation, and a voltage supplied to one of the first inverter and the second inverter in a selected column in which a writing operation sets the output node to a high level.

8. The semiconductor memory device according to claim 5, wherein, when a writing operation sets an output node of the first inverter to a low level, the first power supply control circuit blocks the first voltage supplied to the first inverter.

9. A semiconductor memory device, comprising:
a first inverter and a second inverter which constitute a memory cell and each of which has an input terminal and an output terminal connected crosswise to an output terminal and an input terminal, respectively, of the other;
a first power supply control circuit which supplies a first voltage to the first inverter; and
a second power supply control circuit which supplies a second voltage to the second inverter, wherein the first and second power supply control circuits control the first and second voltages, respectively, supplied to the first and second inverters in a selected memory cell for a writing operation in accordance with write data, the first and second power supply control circuits include a first p-channel MOS transistor, a second p-channel MOS transistor, a first AND circuit, and a second AND circuit, and the first inverter is connected to a drain of the first p-channel MOS transistor, the second inverter is connected to a drain of the second p-channel MOS transistor, and the second voltage is supplied to sources of the first and second p-channel MOS transistors.

10. The semiconductor memory device according to claim 9, wherein the first and second power supply control circuits further include a first n-channel MOS transistor and a second n-channel MOS transistor, drains of the first n-channel MOS transistor and the second n-channel MOS transistor are connected to a node where the source of the first p-channel transistor is connected to the source of the second p-channel MOS transistor, a source of the first n-channel MOS transistor is connected to the drain of the first p-channel MOS transistor, and a source of the second n-channel MOS transistor is connected to the drain of the second p-channel MOS transistor.

11. The semiconductor memory device according to claim 9, wherein, when a writing operation sets an output node of the first inverter to a low level, the first power supply control circuit supplies the first inverter with the first voltage lower than the second voltage supplied to the second inverter by the second power supply control circuit.

12. The semiconductor memory device according to claim 11, wherein the first and second power supply control circuits use, as the second voltage, all of a voltage supplied to one of the first and second inverters for a reading operation, a voltage supplied to one of the first and second inverters in an unselected column for a writing operation, and a voltage supplied to one of the first inverter and the second inverter in a selected column in which a writing operation sets the output node to a high level.

13. The semiconductor memory device according to claim 9, wherein, when a writing operation sets an output node of the first inverter to a low level, the first power supply control circuit blocks the first voltage supplied to the first inverter.

* * * * *